(12) United States Patent
Yang et al.

(10) Patent No.: US 11,061,430 B1
(45) Date of Patent: Jul. 13, 2021

(54) SPREAD SPECTRUM CLOCK GENERATING SYSTEM

(71) Applicant: Si En Technology (Xiamen) Limited, Xiamen (CN)

(72) Inventors: Tsen-Shau Yang, Xiamen (CN); Chen-Ya Peng, Xiamen (CN)

(73) Assignee: SI EN TECHNOLOGY (XIAMEN) LIMITED, Xiamen (CN)

( * ) Notice: Subject to any disclaimer, the term of this patent is extended or adjusted under 35 U.S.C. 154(b) by 0 days.

(21) Appl. No.: 16/932,917

(22) Filed: Jul. 20, 2020

(30) Foreign Application Priority Data

Mar. 25, 2020 (CN) .......................... 202010217193.1

(51) Int. Cl.
| | |
|---|---|
| *G06F 1/08* | (2006.01) |
| *H03M 1/66* | (2006.01) |
| *H03K 21/02* | (2006.01) |
| *H03K 5/26* | (2006.01) |

(52) U.S. Cl.
CPC ................ *G06F 1/08* (2013.01); *H03K 5/26* (2013.01); *H03K 21/02* (2013.01); *H03M 1/66* (2013.01)

(58) Field of Classification Search
CPC ........... H03D 7/14; H03D 7/1458; G06F 1/08
See application file for complete search history.

(56) References Cited

U.S. PATENT DOCUMENTS 8,340,152 B2 * 12/2012 Jeanson ................. H04B 15/04
375/130

\* cited by examiner

*Primary Examiner* — Hai L Nguyen
(74) *Attorney, Agent, or Firm* — McClure, Qualey & Rodack, LLP

(57) ABSTRACT

A spread spectrum clock generating system is provided. The digital frequency detecting unit is configured for receiving a reference signal and a feedback signal and for comparing the reference signal and the feedback signal to generate a frequency difference signal. The digital loop filtering unit is signally connected to the digital frequency detecting unit and outputs a clock controlling signal based on the frequency difference signal. The digital spread spectrum controlling unit is configured for receiving the reference signal to output a spread spectrum signal. The digital-analog converting unit is configured for converting the clock controlling signal to a first controlling signal and for converting the spread spectrum signal to a second controlling signal. The analog controlled oscillating unit is configured for receiving the first controlling signal and the second controlling signal to output a spread spectrum clock signal.

13 Claims, 8 Drawing Sheets

SPREAD SPECTRUM CLOCK GENERATING SYSTEM

RELATED APPLICATIONS

This application claims priority to CN Application Serial Number 202010217193.1, filed Mar. 25, 2020, which is herein incorporated by reference.

BACKGROUND

Technical Field

The present disclosure relates to a clock generating system. More particularly, the present disclosure relates to a spread spectrum clock generating system.

Description of Related Art

Digital electronic devices are popular owing to the development of the technology, and in order to improve the performance of the digital electronic devices, the data processing speed thereof also needs to be increased. In general, the digital electronic device employs a clock circuit to provide the clock signal, but the electromagnetic interference (EMI) will become serous if the clock speed is increased. Hence, how to lower the EMI becomes a problem to be solved for the scholars and practitioners.

A spread spectrum clock generating circuit is developed to lower the EMI, and a conventional spread spectrum clock generating circuit includes a phase lock loop formed by a phase detector, a pump, a low pass filter and a voltage controlled oscillator. The phase detector drives the pump after comparing the phase difference between the reference signal and the feedback signal. The output signal from the pump is filtered by the low pass filter and then is combined with the triangle wave to drive the voltage controlled oscillator, thereby outputting the spread spectrum clock signal. However, the cost of the lower pass filter is high, and the analog circuit is not easily adjustable; consequently, the spread spectrum clock generating circuit needs to be improved.

Based on the abovementioned problems, how to effectively improve the configuration of the spread spectrum clock generating circuit to lower the cost and increase the adjusting capability becomes a pursuit target for the practitioners.

SUMMARY

According to one aspect of the present disclosure, a spread spectrum clock generating system including a digital frequency detecting unit, a digital loop filtering unit, a digital spread spectrum controlling unit, a digital-analog converting unit and an analog controlled oscillating unit is provided. The digital frequency detecting unit is configured for receiving a reference signal and a feedback signal and for comparing the reference signal and the feedback signal to generate a frequency difference signal. The digital loop filtering unit is signally connected to the digital frequency detecting unit and outputs a clock controlling signal based on the frequency difference signal. The digital spread spectrum controlling unit is configured for receiving the reference signal to output a spread spectrum signal. The digital-analog converting unit is signally connected to the digital loop filtering unit and the digital spread spectrum controlling unit, and the digital-analog converting unit is configured for converting the clock controlling signal to a first controlling signal and for converting the spread spectrum signal to a second controlling signal. The analog controlled oscillating unit is configured for receiving the first controlling signal and the second controlling signal to output a spread spectrum clock signal.

According to another aspect of the present disclosure, a spread spectrum clock generating system including a digital frequency detecting unit, a digital loop filtering unit, a digital spread spectrum controlling unit, a digital-analog converting unit and an analog controlled oscillating unit is provided. The digital frequency detecting unit is configured for receiving a reference signal and a feedback signal and for comparing the reference signal and the feedback signal to generate a frequency difference signal. The digital loop filtering unit is signally connected to the digital frequency detecting unit and outputs a clock controlling signal based on the frequency difference signal. The digital loop filtering unit includes an integrator and an adjusting selector. The integrator is configured for receiving the clock controlling signal and for outputting a fine tuning signal after adjusting the clock controlling signal by the frequency difference signal. The adjusting selector is configured for receiving a selecting command and for selecting the fine tuning signal as the clock controlling signal. The digital spread spectrum controlling unit is configured for receiving the reference signal to output a spread spectrum signal. The digital-analog converting unit is signally connected to the digital loop filtering unit and the digital spread spectrum controlling unit, and the digital-analog converting unit is configured for converting the clock controlling signal to a first controlling signal and for converting the spread spectrum signal to a second controlling signal. The analog controlled oscillating unit is configured for receiving the first controlling signal and the second controlling signal to output a spread spectrum clock signal.

BRIEF DESCRIPTION OF THE DRAWINGS

The disclosure can be more fully understood by reading the following detailed description of the embodiments, with reference made to the accompanying drawings as follows.

DETAILED DESCRIPTION

It will be understood that when an element (or mechanism or module) is referred to as being "disposed on", "connected to" or "coupled to" another element, it can be directly disposed on, connected or coupled to the other elements, or it can be indirectly disposed on, connected or coupled to the other elements, that is, intervening elements may be present. In contrast, when an element is referred to as being "directly disposed on", "directly connected to" or "directly coupled to" another element, there are no intervening elements present.

In addition, the terms first, second, third, etc. are used herein to describe various elements or components, these elements or components should not be limited by these terms. Consequently, a first element or component discussed below could be termed a second element or component.

Figure 1:
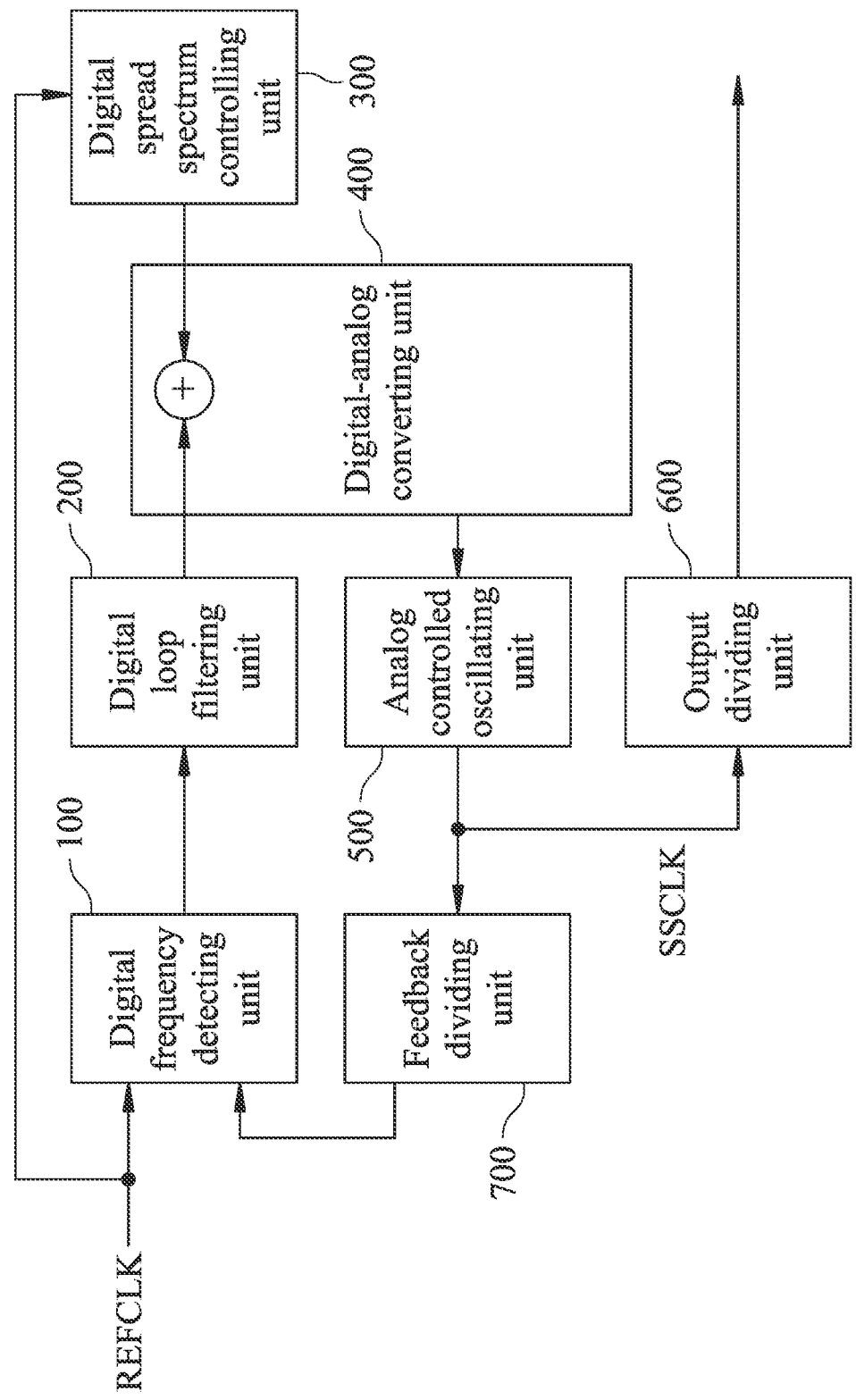
FIG. 1 is a block diagram showing a spread spectrum clock generating system according to one embodiment of the present disclosure.
Figure 2:
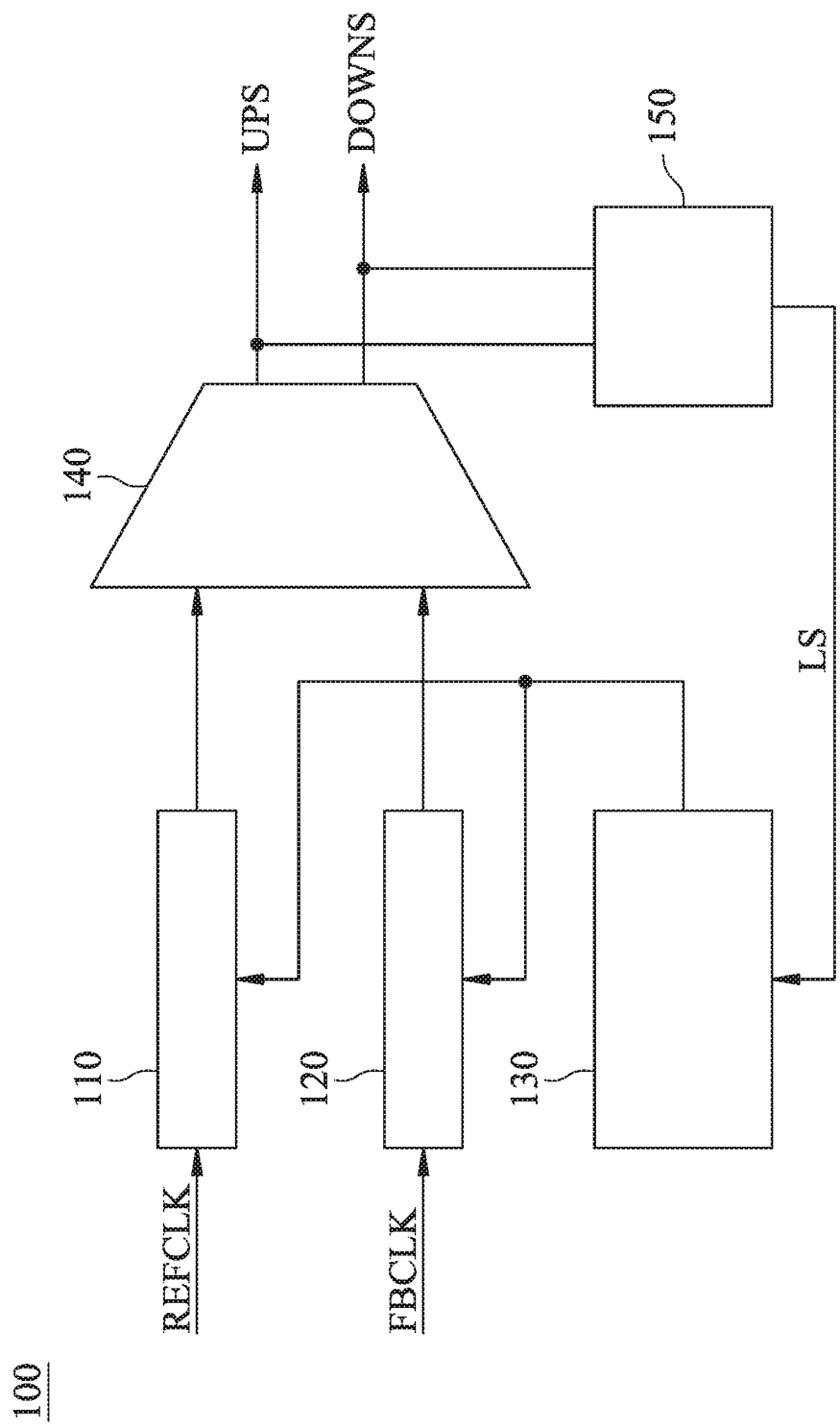
FIG. 2 is a detailed block diagram showing a digital frequency detecting unit of the spread spectrum clock generating system of FIG. 1.
Figure 3:
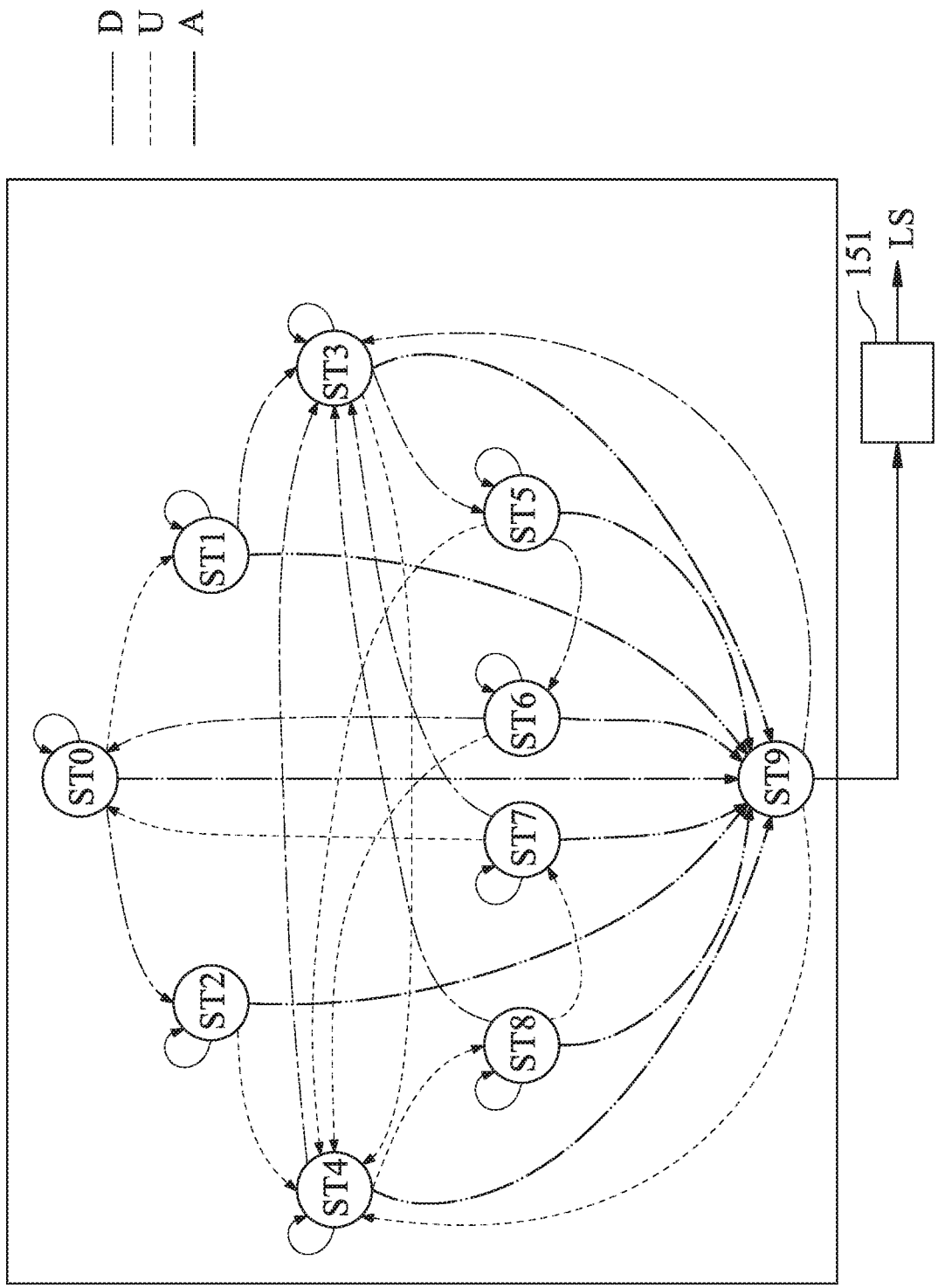
FIG. 3 is a judging flow chart of a locking judger of the spread spectrum clock generating system of FIG. 1.

FIG. 1 is a block diagram showing a spread spectrum clock generating system 10 according to one embodiment of the present disclosure. FIG. 2 is a detailed block diagram showing a digital frequency detecting unit 100 of the spread spectrum clock generating system 10 of FIG. 1. FIG. 3 is a judging flow chart of a locking judger 150 of the spread spectrum clock generating system 10 of FIG. 1. The spread spectrum clock generating system 10 includes a digital frequency detecting unit 100, a digital loop filtering unit 200, a digital spread spectrum controlling unit 300, a digital-analog converting unit 400 and an analog controlled oscillating unit 500.

The digital frequency detecting unit 100 is configured for receiving a reference signal REFCLK and a feedback signal FBCLK and for comparing the reference signal REFCLK and the feedback signal FBCLK to generate a frequency difference signal. The digital loop filtering unit 200 is signally connected to the digital frequency detecting unit 100 and outputs a clock controlling signal CCLK (shown in FIG. 4) based on the frequency difference signal. The digital spread spectrum controlling unit 300 is configured for receiving the reference signal REFCLK to output a spread spectrum signal SS (shown in FIG. 5). The digital-analog converting unit 400 is signally connected to the digital loop filtering unit 200 and the digital spread spectrum controlling unit 300, and the digital-analog converting unit 400 is configured for converting the clock controlling signal CCLK to a first controlling signal OCS1 (shown in FIG. 7) and for converting the spread spectrum signal SS to a second controlling signal OCS2 (shown in FIG. 7). The analog controlled oscillating unit 500 is configured for receiving the first controlling signal OCS1 and the second controlling signal OCS2 to output a spread spectrum clock signal SSCLK.

Hence, the digital loop filtering unit 200 has an advantage of low cost, and the digital spread spectrum controlling unit 300 is easily adjustable. The detail of the spread spectrum clock generating system 10 will be described hereafter.

The reference signal REFCLK can be, but not limited to, generated by a crystal oscillator. The spread spectrum clock generating system 10 can further include an output dividing unit 600 and a feedback dividing unit 700 signally connected to the analog controlled oscillating unit 500. The spread spectrum clock signal SSCLK can be used after passing through the output dividing unit 600. The spread spectrum clock signal SSCLK can form the feedback signal FBCLK to enter the digital frequency detecting unit 100 after passing through the feedback dividing unit 700. The frequency difference signal includes an up pulse UPS and a down pulse DOWNS. The digital frequency detecting unit 100 selectively outputs at least one of the up pulse UPS and the down pulse DOWNS after comparing the reference signal REFCLK and the feedback signal FBCLK. When the reference signal REFCLK is larger than the feedback signal FBCLK, the digital frequency detecting unit 100 outputs the up pulse UPS. On the contrary, when the reference signal REFCLK is smaller than the feedback signal FBCLK, the digital frequency detecting unit 100 outputs the down pulse DOWNS. Moreover, if the reference signal REFCLK is substantially equal to the feedback signal FBCLK, the digital frequency detecting unit 100 outputs both of the up pulse UPS and the down pulse DOWNS. In other embodiments, the feedback signal is equal to the spread spectrum clock signal as long as the feedback dividing unit is omitted. Similarly, the output dividing unit can be omitted to allow the spread spectrum clock signal to be used directly.

The digital frequency detecting unit 100 can include a locking judger 150 configured for judging whether a locking status is achieved according to the frequency difference signal and for outputting a locking signal LS. The locking judger 150 includes a locking counter 151 configured for accumulating a counting value. When the locking counter 151 is activated as the locking judger 150 receiving the up pulse UPS and the down pulse DOWNS simultaneously, the counting value is accumulated as long as the locking judger 150 continuously receives the up pulse UPS and the down pulse DOWNS at the same time, and when the counting value is equal to or larger than a threshold value, the locking judger 150 outputs the locking signal LS.

To be more specific, as shown in FIG. 3, difference Stages ST0, ST1, ST2, ST3, ST4, ST5, ST6, ST7, ST8 and ST9 can be entered according to the up pulse UPS or the down pulse DOWNS received by locking judger 150, and, initially, the locking judger 150 stands by at Stage ST0.

In Stage ST0, as the up pulse UPS and the down pulse DOWNS are received simultaneously, represented by Condition A, Stage ST9 is entered and the locking counter 151 is activated. In Stage ST9, as long as Condition A continuously occurs, the counting value will be increased, and the spread spectrum clock generating system 10 enters the locking status when the counting valve achieves the threshold value. On the contrary, in Stage ST9, as the counting valve is smaller than the threshold value and the locking judger 150 only receives the up pulse UPS, represented by Condition U, Stage ST4 is entered and the counting value is reset. The locking counter 151 is turned off and waits for another activation. Similarly, in Stage ST9, as the counting valve is smaller than the threshold value and the locking judger 150 only receives the down pulse DOWNS, represented by Condition D, Stage ST3 is entered and the counting value is reset. The locking counter 151 is turned off and waits for another activation. Additionally, in Stage ST0, Stage ST1 is entered as Condition U occurs, while Stage ST2 is entered as Condition D occurs.

As Condition A occurs in Stage ST1, Stage ST9 is entered. On the other hand, Stage ST3 is entered as Condition D occurs, and Stage ST1 is remained as conditions other than Conditions A and D occur. As Condition A occurs in Stage ST3, Stage ST9 is entered. On the other hand, Stage ST5 is entered as Condition D occurs, and Stage ST4 is entered as Condition U occurs. Stage ST3 is remained as conditions other than Conditions A, D and U occur. As Condition A occurs in Stage ST5, Stage ST9 is entered. On the other hand, Stage ST6 is entered as Condition D occurs, and Stage ST4 is entered as Condition U occurs. Stage ST5 is remained as conditions other than Conditions A, D and U occur. As Condition A occurs in Stage ST6, Stage ST9 is entered. On the other hand, Stage ST0 is returned as Condition D occurs, and Stage ST4 is entered as Condition U occurs. Stage ST6 is remained as conditions other than Conditions A, D and U occur.

As Condition A occurs in Stage ST2, Stage ST9 is entered. On the other hand, Stage ST4 is entered as Condition U occurs, and Stage ST2 is remained as conditions other than Conditions A and U occur. As Condition A occurs in Stage ST4, Stage ST9 is entered. On the other hand, Stage ST8 is entered as Condition U occurs, and Stage ST3 is entered as Condition D occurs. Stage ST4 is remained as conditions other than Conditions A, D and U occur. As Condition A occurs in Stage ST8, Stage ST9 is entered. On the other hand, Stage ST7 is entered as Condition U occurs, and Stage ST3 is entered as Condition D occurs. Stage ST8 is remained as conditions other than Conditions A, D and U occur. As Condition A occurs in Stage ST7, Stage ST9 is entered. On the other hand, Stage ST0 is returned as Condition U occurs, and Stage ST3 is entered as Condition D occurs. Stage ST7 is remained as conditions other than Conditions A, D and U occur.

Hence, the locking judger 150 can decide which Stages ST0 to ST9 is entered according to the up pulse UPS and the down pulse DOWNS, and can decide whether the locking counter 151 is activated to accumulate the counting value. As the counting value is equal to the threshold, the locking status is achieved, and when in the locking status, the feedback signal FBCLK quite approaches or is equal to the reference signal REFCLK.

As shown in FIG. 2, the digital frequency detecting unit 100 can further include a first counter 110, a second counter 120, a counting controller 130 and a frequency comparator 140. The first counter 110 is configured for receiving the reference signal REFCLK and for counting a first pulse number of the reference signal REFCLK within a counting cycle. The second counter 120 is configured for receiving the feedback signal FBCLK and for counting a second pulse number of the feedback signal FBCLK within the counting cycle. The counting controller 130 is configured for receiving the locking signal LS and for adjusting the counting cycle. The frequency comparator 140 is signally connected to the first counter 110 and the second counter 120. The frequency comparator 140 is configured for comparing the first pulse number and the second pulse number and for outputting the frequency difference signal.

In the embodiment of FIGS. 1 and 2, the counting cycle is adjustable. Before achieving the locking status, the counting cycle given by the counting controller 130 can be, for example, T1. The first counter 110 counts the first pulse number of the reference signal REFCLK within T1 and the second counter 120 counts the second pulse number of the feedback signal FBCLK within T1. Then, the first pulse number and the second pulse number are compared by the frequency comparator 140. The reference signal REFCLK is larger than the feedback signal FBCLK as long as the first pulse number is larger than the second pulse number, and thus the frequency comparator 140 outputs the up pulse UPS. On the contrary, the reference signal REFCLK is smaller than the feedback signal FBCLK as long as the first pulse number is smaller than the second pulse number, and thus the frequency comparator 140 outputs the down pulse DOWNS.

When the locking status is confirmed by the locking judger 150, the counting controller 130 receives the locking signal LS and give another counting cycle, for example, T2. T2 is larger than T1. Hence, before achieving the locking status, the counting cycle is short and the comparing speed is high, which leads to increase the locking speed. After achieving the locking status, the counting cycle is long and the comparing speed is low, which increases the stability of the spread spectrum clock generating system 10.

Figure 4:
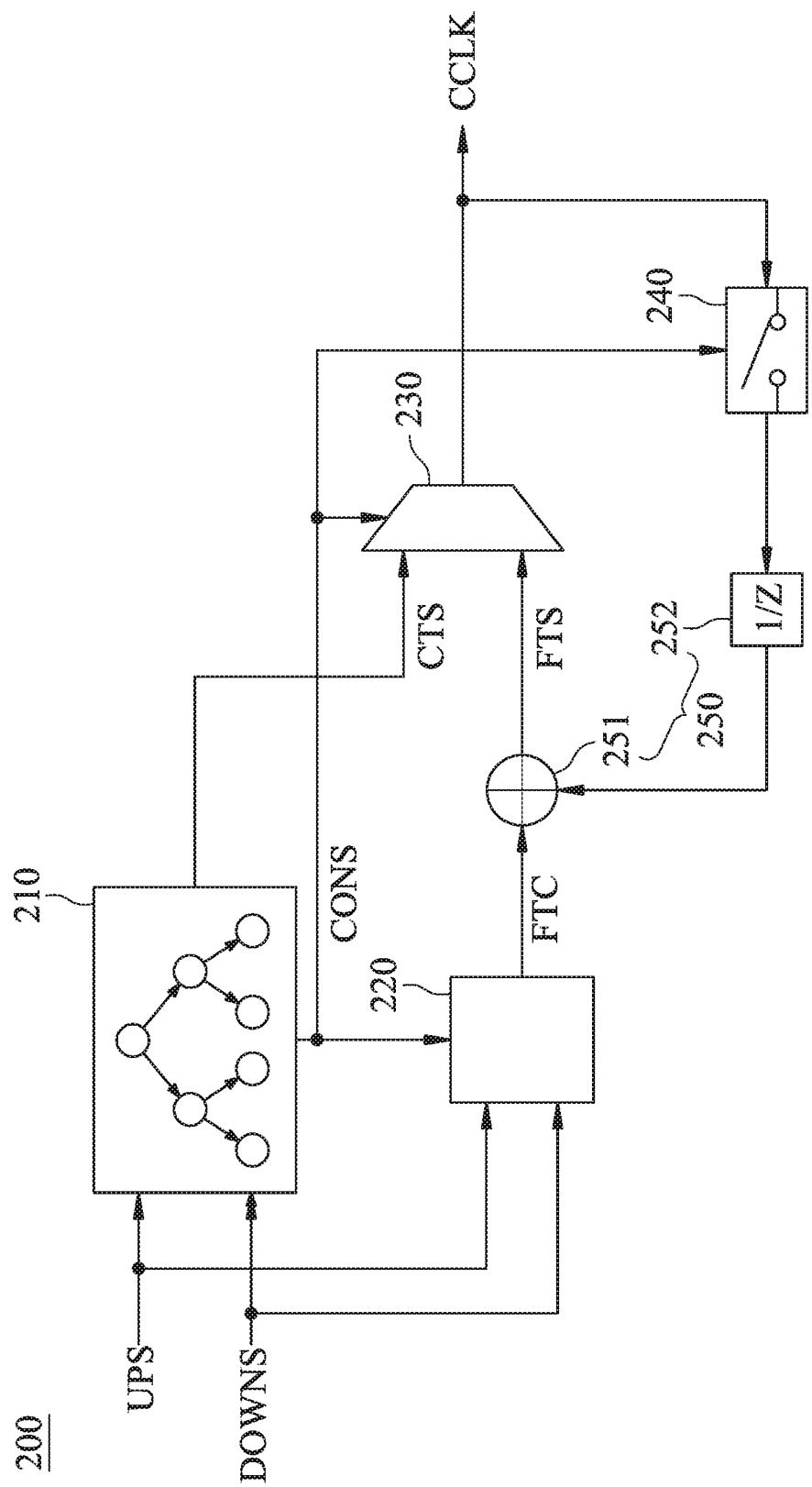
FIG. 4 is a detailed block diagram showing a digital loop filtering unit of the spread spectrum clock generating system of FIG. 1.

FIG. 4 is a detailed block diagram showing a digital loop filtering unit 200 of the spread spectrum clock generating system 10 of FIG. 1. The digital loop filtering unit 200 includes an integrator 250 and an adjusting selector 230. The integrator 250 is configured for receiving the clock controlling signal CCLK and for outputting a fine tuning signal FTS after adjusting the clock controlling signal CCLK by the frequency difference signal. The adjusting selector 230 is configured for receiving a selecting command CONS and for selecting the fine tuning signal FTS as the clock controlling signal CCLK.

Precisely, in addition to the integrator 250 and the adjusting selector 230, the digital loop filtering unit 200 further includes a controlling code selector 210 and a decoder 220. The controlling code selector 210 includes a plurality of controlling curves. The controlling code selector 210 is configured for selecting one of the controlling curves according to the frequency difference signal and outputting a coarse tuning signal CTS. The decoder 220 is configure for receiving the frequency difference signal and for outputting a fine tuning code FTC after decoding the frequency difference signal. The integrator 250 is configured for receiving the clock controlling signal CCLK and the fine tuning code FTC and for outputting the fine tuning signal FTS. The adjusting selector 230 is configured for receiving the coarse tuning signal CTS and the fine tuning signal FTS. The adjusting selector 230 receives the selecting command CONS for choosing one of the coarse tuning signal CTS and the fine tuning signal FTS as the clock controlling signal CCLK. The digital loop filtering unit 200 can further include a switch 240, and the switch 240 is activated by the selecting command CONS to turn on or turn off the integrator 250.

A number of the controlling curves can be, for example, 8. One of the controlling curves can be, for example, 1 MHz to 2 MHz, and another one of the controlling curves can be, for example, 1.5 MHz to 2.5 MHz. The present disclosure is not limited thereto. A binary search method can be used for the digital loop filtering unit 200 to find the proper controller curve. Before the proper controlling curves is found, the switch 240 is opened, and the integrator 250 is not activated and thus in an open loop mode. The selecting command CONS controls the adjusting selector 230 to output the coarse tuning signal CTS corresponding to the selected controlling curve. On the contrary, after the proper controlling curve is found, the status of the switch 240 is changed by the selecting command CONS, and the integrator 250 is activated and thus in a close loop mode.

The integrator 250 includes an adder 251 and a delay element 252. The clock controlling signal CCLK enters the adder 251 after entering the delay element 252; meanwhile, the fine tuning code FTC outputted from the decoder 220 enters the adder 251 to fine tune the recorded clock controlling signal CCLK to generate the fine tuning signal FTS, and the selecting command CONS controls the adjusting selector 230 to output the fine tuning signal FTS. If only the up pulse UPS is received by the decoder 220, the outputted fine tuning code FTC is set to 1. If only the down pulse DOWNS is received by the decoder 220, the outputted fine tuning code FTC is set to −1. If the up pulse UPS and the down pulse DOWNS are received by the decoder 220 simultaneously, the outputted fine tuning code FTC is set to 0. Therefore, the clock controlling signal CCLK currently outputted can be fine-tuned to decrease the vibration of the spread spectrum clock generating system 10.

Figure 5:
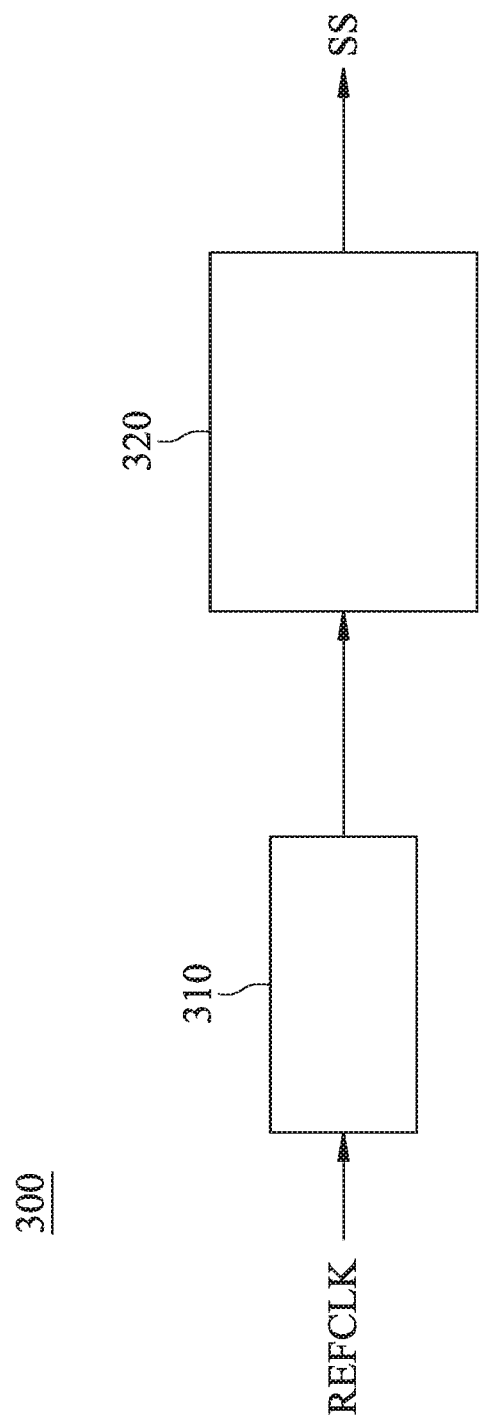
FIG. 5 is a detailed block diagram showing a digital spread spectrum controlling unit of the spread spectrum clock generating system of FIG. 1.
Figure 6:
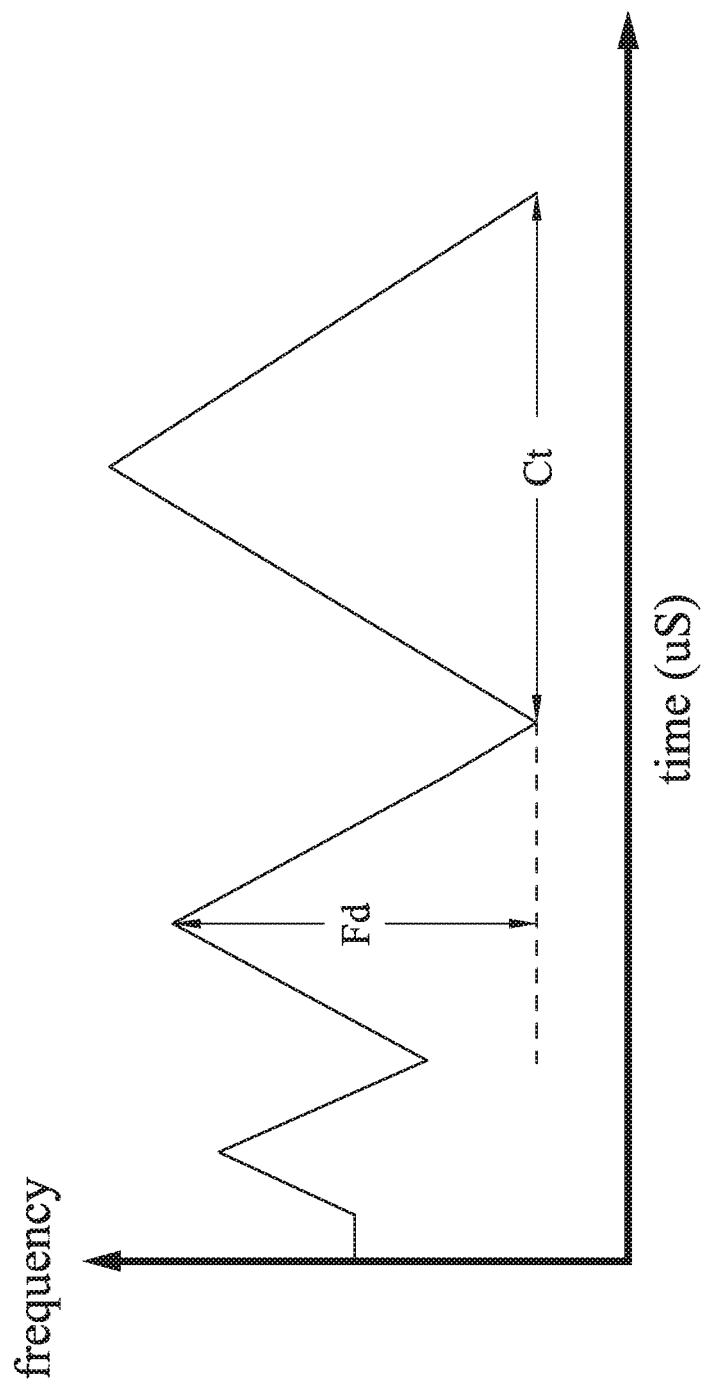
FIG. 6 is a triangle wave generated by the digital spread spectrum controlling unit of the spread spectrum clock generating system of FIG. 1.

FIG. 5 is a detailed block diagram showing a digital spread spectrum controlling unit 300 of the spread spectrum clock generating system 10 of FIG. 1. FIG. 6 is a triangle wave generated by the digital spread spectrum controlling unit 300 of the spread spectrum clock generating system 10 of FIG. 1. The digital spread spectrum controlling unit 300 further includes a spread spectrum divider 310 and a spread spectrum counter 320. The spread spectrum divider 310 is configured for receiving the reference signal REFCLK and for outputting a dividing signal. The spread spectrum counter 320 is signally connected to the spread spectrum divider 310. The spread spectrum counter 320 is configured for receiving the dividing signal and for outputting the spread spectrum signal SS. In other words, as shown in FIG. 6, the spread spectrum divider 310 and spread spectrum counter 320 can be set by a user freely to obtain required values. The reference signal REFCLK can be divided by the spread spectrum divider 310 to scale the cycle time Ct up or down; subsequently, after processing by the spread spectrum counter 320, the deviation Fd can be scaled up or down. Finally, the required triangle wave can be generated.

Figure 7:
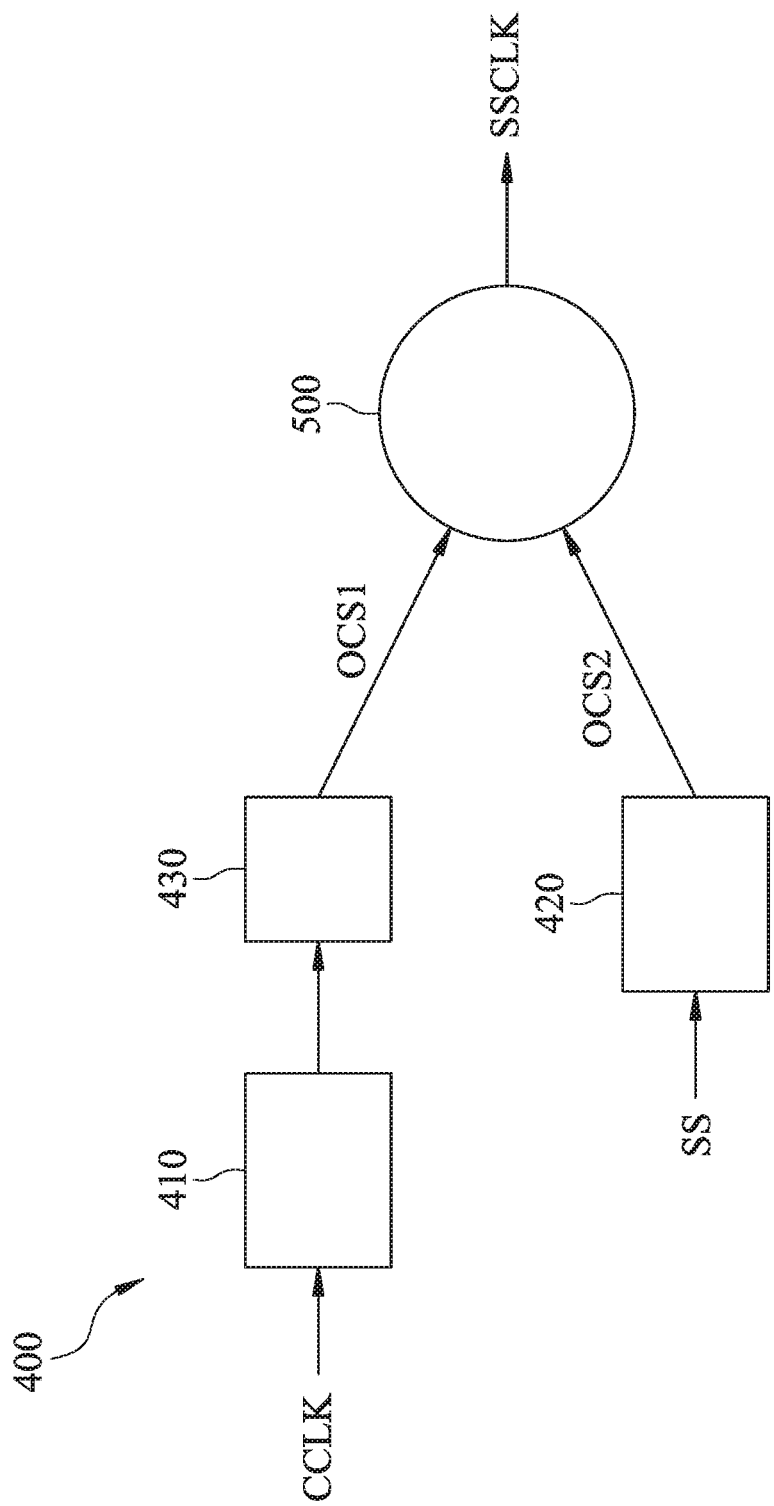
FIG. 7 is a detailed block diagram showing a digital-analog converting unit and an analog controlled oscillating unit of the spread spectrum clock generating system of FIG. 1.

FIG. 7 is a detailed block diagram showing a digital-analog converting unit 400 and an analog controlled oscillating unit 500 of the spread spectrum clock generating system 10 of FIG. 1. The digital-analog converting unit 400 includes a first voltage converter 410 configured for receiving the clock controlling signal CCLK and for outputting a first voltage signal, a voltage-current converter 430 configured for receiving the first voltage signal and for outputting a first controlling signal OCS1, and a second voltage converter 420 configured for receiving the spread spectrum signal SS and for outputting a second voltage signal OCS2.

The clock controlling signal CCLK and the spread spectrum signal SS are in digital formats, and the bit length of the clock controlling signal CCLK and the bit length of the spread spectrum signal SS can be the same or different. In other embodiments, the bit length of the clock controlling signal can be longer than that of the spread spectrum signal for fine control. The first voltage converter 410 can convert the clock controlling signal CCLK from digital to analog to generate the first voltage signal, and then the first voltage signal is converted from a voltage-type to a current-type by the voltage-current converter 430 to be served as the first controlling signal OCS1. Similarly, the spread spectrum signal SS can be converted from a digital form to an analog form by the second voltage converter 420 to be served as the second controlling signal OCS2.

Before achieving the locking status, the second voltage converter 420 will not operate, and only the first voltage converter 410 and the voltage-current converter 430 operate. Hence, the analog controlled oscillating unit 500 is driven by the first controlling signal OCS1. After achieving the locking status, the second voltage converter 420 activates, and the analog controlled oscillating unit 500 is driven by the first controlling signal OCS1 and the second controlling signal OCS2 to generate the spread spectrum clock signal SSCLK.

Figure 8:
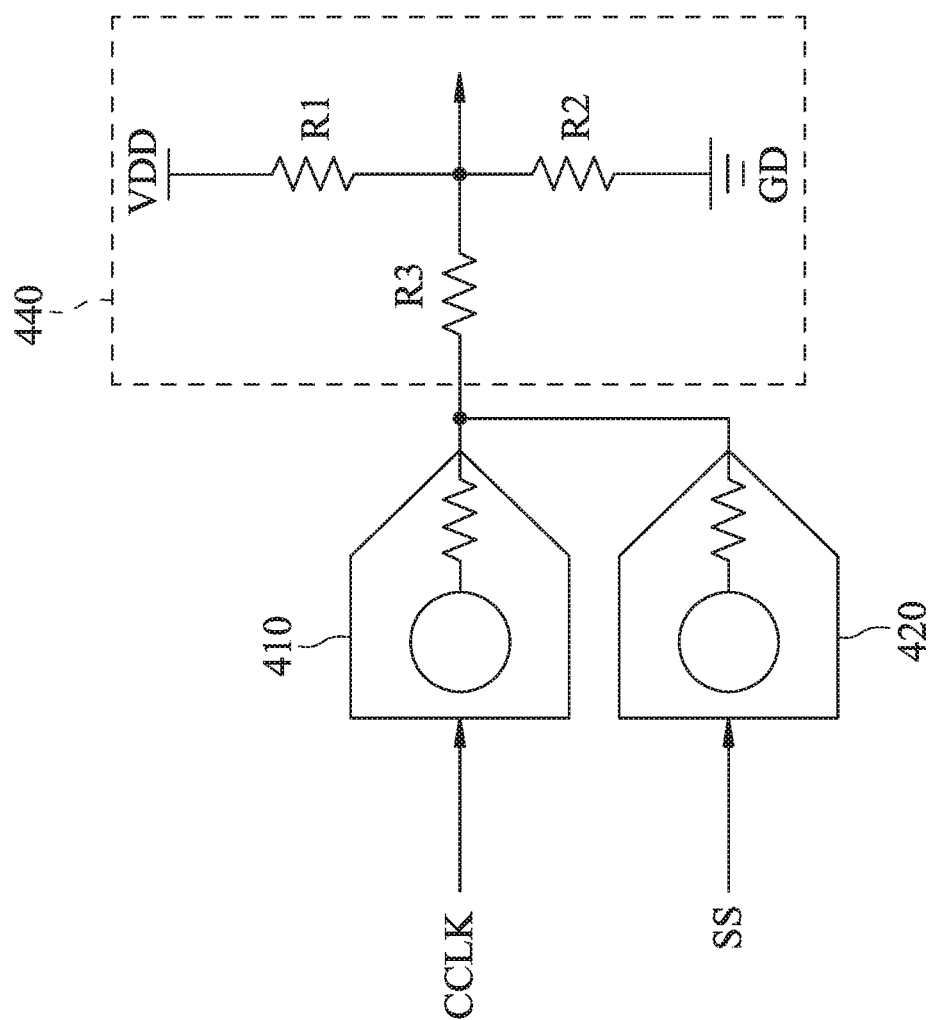
FIG. 8 is a detailed block diagram showing a voltage adjusting module of the spread spectrum clock generating system of FIG. 1.

FIG. 8 is a detailed block diagram showing a voltage adjusting module 440 of the spread spectrum clock generating system 10 of FIG. 1. The digital-analog converting unit 400 further includes a voltage adjusting module 440 including a first resistance R1, a second resistance R2 and a third resistance R3. The first resistance R1 includes a first terminal connected to a reference voltage VDD. The second resistance R2 includes a first terminal and a second terminal. The first terminal of the second resistance R2 is connected to a second terminal of the first resistance R1 and the second terminal of the second resistance R2 is connected to a ground GD. The third resistance R3 includes a first terminal and a second terminal. The first terminal of the third resistance R3 is connected to the first voltage converter 410 and the second voltage converter 420, and the second terminal of the third resistance R3 is connected to the first terminal of the second resistance R2.

To be more specific, the first voltage converter 410 and the second voltage converter 420 can both have the R2R DAC structure. The first voltage converter 410 and the second voltage converter 420 can be connected to the voltage adjusting module 440, respectively, and the resistance values of the first resistance R1, the second resistance R2 and the third resistance R3 can be modified according to the characteristics of the analog controlled oscillating unit 500. For example, if the analog controlled oscillating unit 500 is operable between 1V to 2V, through modifying the resistance values, digits "000" can correspond to 0V and digits "111" can correspond to 2V, thereby allowing a linear adjustment.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A spread spectrum clock generating system, comprising:
    a digital frequency detecting unit configured for receiving a reference signal and a feedback signal and for comparing the reference signal and the feedback signal to generate a frequency difference signal;
    a digital loop filtering unit signally connected to the digital frequency detecting unit and outputting a clock controlling signal based on the frequency difference signal;
    a digital spread spectrum controlling unit configured for receiving the reference signal to output a spread spectrum signal;
    a digital-analog converting unit signally connected to the digital loop filtering unit and the digital spread spectrum controlling unit, the digital-analog converting unit configured for converting the clock controlling signal to a first controlling signal and for converting the spread spectrum signal to a second controlling signal;
    an analog controlled oscillating unit configured for receiving the first controlling signal and the second controlling signal to output a spread spectrum clock signal; and
    a feedback dividing unit signally connected to the analog controlled oscillating unit and receiving the spread spectrum clock signal to form the feedback signal.

2. The spread spectrum clock generating system of claim 1, wherein the digital frequency detecting unit comprises:
    a locking judger configured for judging whether a locking status is achieved according to the frequency difference signal and for outputting a locking signal.

3. The spread spectrum clock generating system of claim 2, wherein the digital frequency detecting unit further comprises:
- a first counter configured for receiving the reference signal and for counting a first pulse number of the reference signal within a counting cycle;
- a second counter configured for receiving the feedback signal and for counting a second pulse number of the feedback signal within the counting cycle;
- a counting controller configure for receiving the locking signal and for adjusting the counting cycle; and
- a frequency comparator signally connected to the first counter and the second counter, the frequency comparator configured for comparing the first pulse number and the second pulse number and for outputting the frequency difference signal.

4. The spread spectrum clock generating system of claim 1, wherein the digital loop filtering unit comprises:
- a controlling code selector comprising a plurality of controlling curves, the controlling code selector configured for selecting one of the controlling curves according to the frequency difference signal and for outputting a coarse tuning signal;
- a decoder configure for receiving the frequency difference signal and for outputting a fine tuning code after decoding the frequency difference signal;
- an integrator configured for receiving the clock controlling signal and the fine tuning code and for outputting a fine tuning signal; and
- an adjusting selector configured for receiving the coarse tuning signal and the fine tuning signal, the adjusting selector receiving a selecting command for choosing one of the coarse tuning signal and the fine tuning signal as the clock controlling signal.

5. The spread spectrum clock generating system of claim 1, wherein the digital-analog converting unit comprises:
- a first voltage converter configured for receiving the clock controlling signal and for outputting a first voltage signal;
- a voltage-current converter configured for receiving the first voltage signal and for outputting a first controlling signal; and
- a second voltage converter configured for receiving the spread spectrum signal and for outputting a second voltage signal.

6. The spread spectrum clock generating system of claim 5, wherein the digital-analog converting unit further comprises a voltage adjusting module, and the voltage adjusting module comprises:
- a first resistance comprising a first terminal connected to a reference voltage;
- a second resistance comprising a first terminal and a second terminal, wherein the first terminal of the second resistance is connected to a second terminal of the first resistance and the second terminal of the second resistance is connected to a ground; and
- a third resistance comprising a first terminal and a second terminal, wherein the first terminal of the third resistance is connected to the first voltage converter and the second voltage converter, and the second terminal of the third resistance is connected to the first terminal of the second resistance.

7. The spread spectrum clock generating system of claim 1, wherein the digital spread spectrum controlling unit further comprises:
- a spread spectrum divider configure for receiving the reference signal and for outputting a dividing signal; and
- a spread spectrum counter signally connected to the spread spectrum divider, the spread spectrum counter configured for receiving the dividing signal and for outputting the spread spectrum signal.

8. A spread spectrum clock generating system, comprising:
- a digital frequency detecting unit configured for receiving a reference signal and a feedback signal and for comparing the reference signal and the feedback signal to generate a frequency difference signal;
- a digital loop filtering unit signally connected to the digital frequency detecting unit and outputting a clock controlling signal based on the frequency difference signal, the digital loop filtering unit comprising:
  - an integrator configured for receiving the clock controlling signal and for outputting a fine tuning signal after adjusting the clock controlling signal by the frequency difference signal; and
  - an adjusting selector configured for receiving a selecting command and for choosing the fine tuning signal as the clock controlling signal;
- a digital spread spectrum controlling unit configured for receiving the reference signal to output a spread spectrum signal;
- a digital-analog converting unit signally connected to the digital loop filtering unit and the digital spread spectrum controlling unit, the digital-analog converting unit configured for converting the clock controlling signal to a first controlling signal and for converting the spread spectrum signal to a second controlling signal;
- an analog controlled oscillating unit configured for receiving the first controlling signal and the second controlling signal to output a spread spectrum clock signal; and
- a feedback dividing unit signally connected to the analog controlled oscillating unit and receiving the spread spectrum clock signal to form the feedback signal.

9. The spread spectrum clock generating system of claim 8, wherein the digital frequency detecting unit comprises:
- a locking judger configured for judging whether a locking status is achieved according to the frequency difference signal and for outputting a locking signal.

10. The spread spectrum clock generating system of claim 9, wherein the locking judger comprises:
- a locking counter configured for accumulating a counting value;
- wherein the frequency difference signal comprises an up pulse and a down pulse, when the locking counter is activated as the locking judger receiving the up pulse and the down pulse simultaneously, the counting value is accumulated as long as the locking judger continuously receives the up pulse and the down pulse at the same time, and when the counting value is equal to or larger than a threshold value, the locking judger outputs the locking signal.

11. The spread spectrum clock generating system of claim 9, wherein the digital frequency detecting unit further comprises:
- a first counter configured for receiving the reference signal and for counting a first pulse number of the reference signal within a counting cycle;
- a second counter configured for receiving the feedback signal and for counting a second pulse number of the reference signal within the counting cycle;

a counting controller configure for receiving the locking signal and for adjusting the counting cycle; and a frequency comparator signally connected to the first counter and the second counter, the frequency comparator configured for comparing the first pulse number and the second pulse number and for outputting the frequency difference signal.

12. The spread spectrum clock generating system of claim 8, wherein the digital-analog converting unit comprises a first voltage converter configured for receiving the clock controlling signal and for outputting a first voltage signal;

a voltage-current converter configured for receiving the first voltage signal and for outputting a first controlling signal;

a second voltage converter configured for receiving the spread spectrum signal and for outputting a second voltage signal; and a voltage adjusting module, comprising:

a first resistance comprising a first terminal connected to a reference voltage;

a second resistance comprising a first terminal and a second terminal, wherein the first terminal of the second resistance is connected to a second terminal of the first resistance and the second terminal of the second resistance is connected to a ground; and a third resistance comprising a first terminal and a second terminal, wherein the first terminal of the third resistance is connected to the first voltage converter and the second voltage converter, and the second terminal of the third resistance is connected to the first terminal of the second resistance.

13. The spread spectrum clock generating system of claim 8, wherein the digital spread spectrum controlling unit further comprises:

a spread spectrum divider configure for receiving the reference signal and for outputting a dividing signal; and a spread spectrum counter signally connected to the spread spectrum divider, the spread spectrum counter configured for receiving the dividing signal and for outputting the spread spectrum signal.

* * * * *